(12) United States Patent
Stuckey et al.

(10) Patent No.: US 6,227,373 B1
(45) Date of Patent: May 8, 2001

(54) ELECTRONIC DEVICE HANDLING SYSTEM AND METHOD

(75) Inventors: Larry R. Stuckey, San Diego; Alton R. Lindsey, Jr., El Cajon; Ronnie E. Torres, Bonita; Ira B. Ramin, Poway, all of CA (US)

(73) Assignee: Delta Design, Inc., San Diego, CA (US)

( * ) Notice: Subject to any disclaimer, the term of this patent is extended or adjusted under 35 U.S.C. 154(b) by 0 days.

(21) Appl. No.: 09/111,066

(22) Filed: Jul. 7, 1998

Related U.S. Application Data

(60) Provisional application No. 60/052,423, filed on Jul. 14, 1997.

(51) Int. Cl.[7] .............................. B07C 5/02; B65G 57/00
(52) U.S. Cl. .................. 209/3.1; 209/922; 414/788.7; 414/789.8; 414/790.1
(58) Field of Search .......................... 209/3.1, 552, 922; 414/788.4, 788.7, 789.7, 789.9, 790.1, 790.9, 789.8, 791, 791.6

(56) References Cited

U.S. PATENT DOCUMENTS

| | | | |
|---|---|---|---|
| 4,878,659 | * 11/1989 | Besemann | 414/790.1 X |
| 5,255,584 | * 10/1993 | Fakler | 414/790.1 X |
| 5,669,755 | * 9/1997 | Zahn | 414/789.8 X |
| 5,807,066 | * 9/1998 | Smith | 414/788.7 X |

FOREIGN PATENT DOCUMENTS 63-208432 * 8/1988 (JP) ................... 414/788.7

* cited by examiner

Primary Examiner—Tuan N. Nguyen
(74) Attorney, Agent, or Firm—Gray Cary Ware & Freidenrich

(57) ABSTRACT

An apparatus for handling electronic devices in a system that assigns a category corresponding to one of a plurality of predetermined categories to the electronic devices and sorts the electronic devices according to the categories is provided. A plurality of platforms, each for supporting one tray that carries one or more electronic devices, and each platform corresponding to one of the categories, are vertically stacked in a predetermined order according to the plurality of categories. A group of the stacked platforms are separated from a platform located at a first position corresponding to a particular category corresponding to the category of an electronic device to expose a tray and enable the electronic device to be placed on the tray. A method of handling electronic devices is also provided.

21 Claims, 16 Drawing Sheets

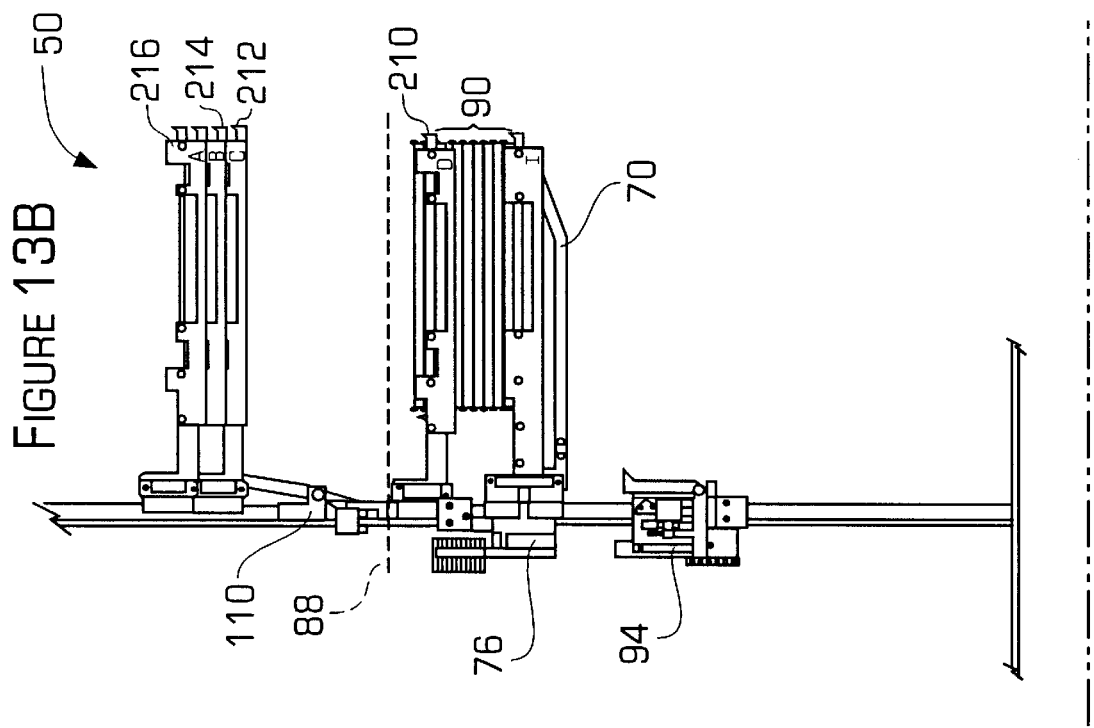
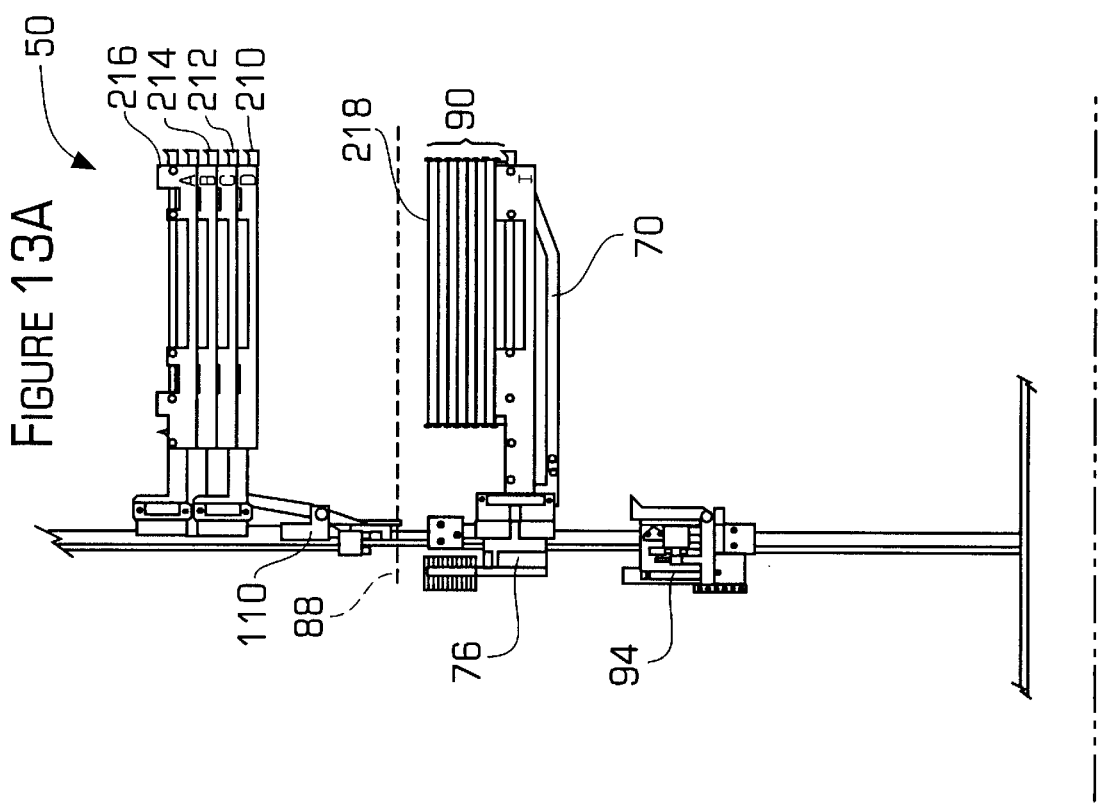

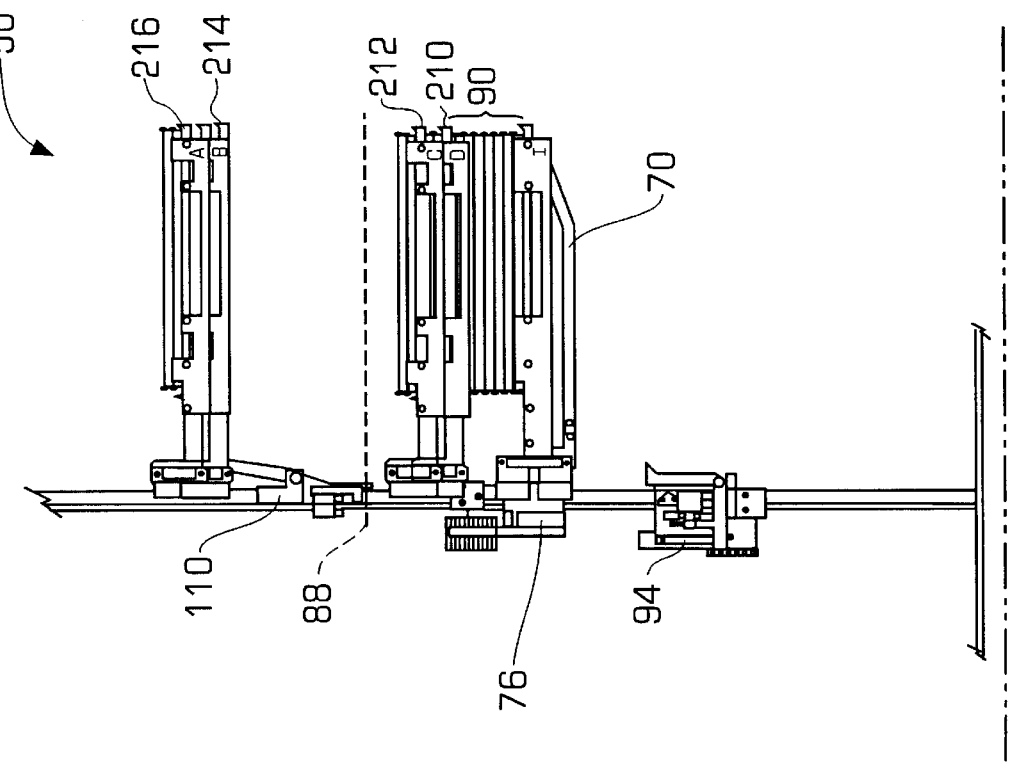
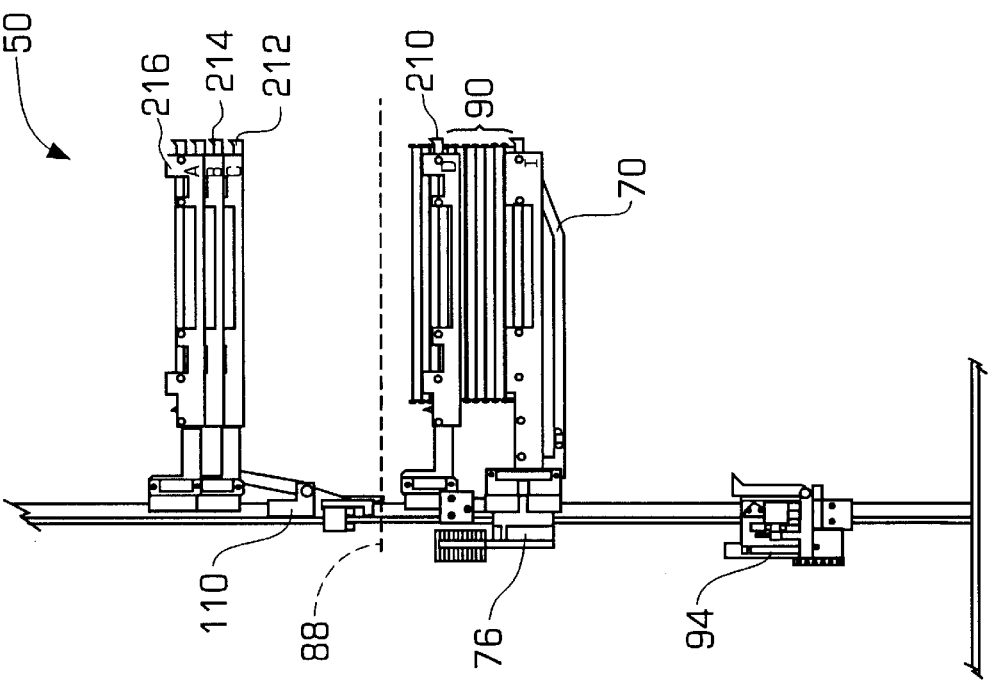

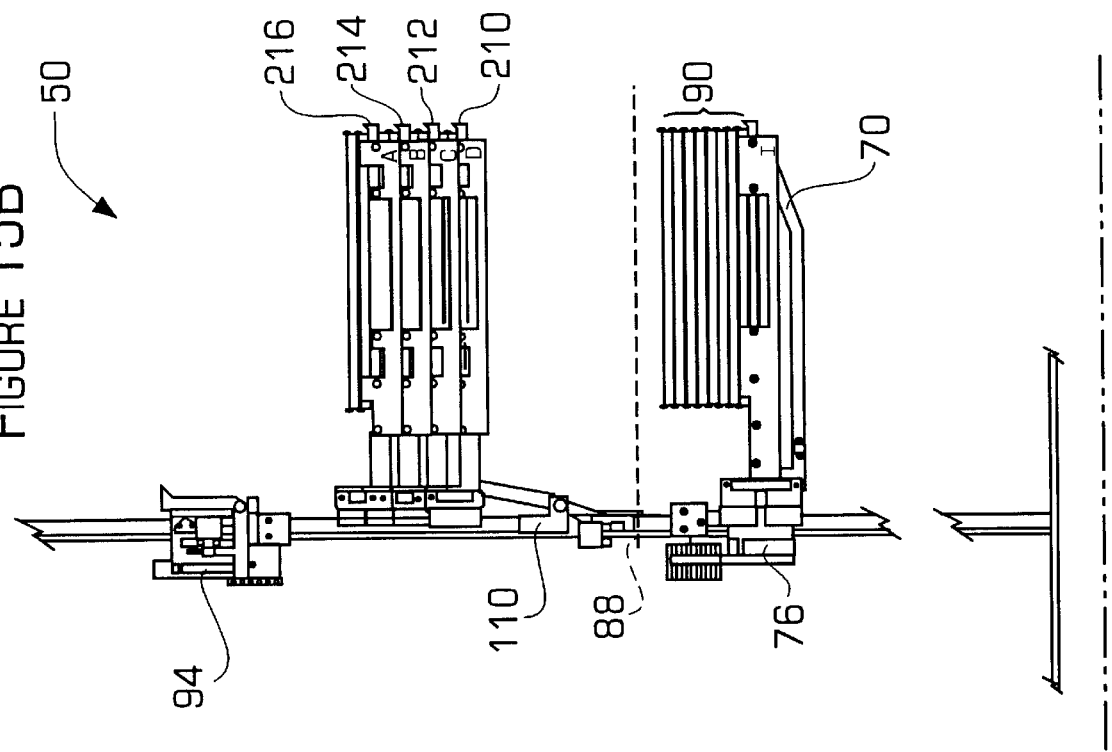
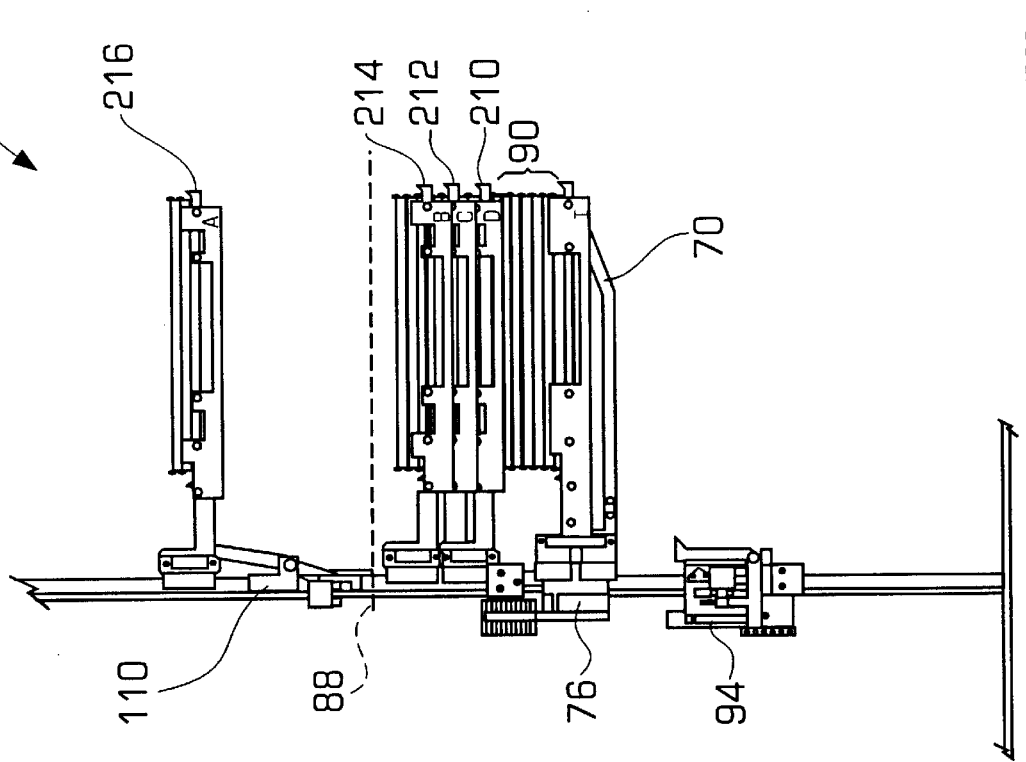

ELECTRONIC DEVICE HANDLING SYSTEM AND METHOD

This application claims the benefit of Provisional No. 60/052,423 filed Jul. 14, 1997.

BACKGROUND OF THE INVENTION

This invention relates generally to a system and method for handling electronic devices, and more particularly to a system and method for loading untested electronic devices into a machine, and for sorting tested electronic devices into multiple categories according to a sort category code assigned by a tester attached to the machine.

Conventional handlers, as described below and illustrated in FIG. 1A, are very expensive and occupy a large amount of floor space in the manufacturing facility. Thus, it is desirable to provide a handling system that can supply untested electronic devices to the tester at the necessary speed as well as sort tested electronic devices quickly into a plurality of sort categories, is less expensive to build than conventional handling systems and occupies less floor space than conventional handing systems.

In a conventional system for handling devices in a testing environment, the sort bins are horizontally located with respect to each other. This conventional handling system is slow because a second pick-and-place head must move horizontally a great distance in order to place a tested electronic device in either a pass category bin or a rejected category bin, or otherwise place it in a bin corresponding to its performance characteristics. As the number of sort category bins increases, the travel time required for the second pick-and-place head to place an electronic device into a sort category bin increases to unacceptable levels. In addition, the size of the handling machine, known as a footprint, increases dramatically because each additional sort category increases the footprint.

Conventional handling systems provide some ability to sort and handle electronic devices, but none of the conventional handling systems provide an electronic device handling system that can rapidly sort electronic devices into a plurality of sort categories, is less expensive to build than conventional handling systems, and has a small footprint even for a system with a plurality of sort category bins.

There is a need for such a system and method for handling electronic devices, and it is to this end that the present invention is directed.

SUMMARY OF THE INVENTION

The invention addresses the foregoing and other problems attendant to known electronic device handling systems and methods by providing an electronic device handling system and method which is fast enough to handle electronic devices in any testing system with any number of sort categories. The invention also provides an electronic device handling system and method that is less expensive to build because a single pick-and-place head may be used to access all of the input and sort category platforms. In addition, the invention also provides an electronic device handling system that may have a smaller footprint because the sort category platforms are stacked vertically.

The invention also provides vertical stacking of an input stack of one or more input trays, and a plurality of sort category stacks which provides various advantages. The overall floor space occupied by the handler system (i.e., the footprint) is reduced as compared to conventional handling systems and does not increase when additional sort categories are added. In addition, any sort category or input stack may be accessed by a single pick-and-place head and the pick-and-place assembly must move only a small distance in order to access any of the sort categories. In addition, the total number of trays within each sort category is dynamically allocable so that the system cannot run out of storage space for a particular sort category. In addition, only the single pick-and-place tray position needs to be aligned unlike a conventional system in which each sort category stack requires precise alignment.

In accordance with the invention, an apparatus for handling electronic devices in a system that assigns a category corresponding to one of a plurality of predetermined categories to said electronic devices and sorts said electronic devices according to said categories, is provided wherein a plurality of platforms, each for supporting one or more trays that carries one or more electronic devices, and each platform corresponding to one of said categories, are vertically stacked in a predetermined order according to said plurality of categories, and a group of the stacked platforms are separated from a platform located at a first position corresponding to a particular category corresponding to the category of an electronic device to expose a tray and enable the electronic device to be placed on said tray. A method of handling electronic devices is also provided.

BRIEF DESCRIPTION OF THE DRAWINGS

FIGS. 13A and 13B are side views of an electronic device handling system in accordance with the invention in an input position and in a sort position;

FIGS. 14A and 14B are side views of an electronic device handling system in accordance with the invention sorting electronic devices into a first sort category and sorting electronic devices into a second sort category, respectively; and FIGS. 15A and 15B are side views of an electronic device handling system in accordance with the invention in a sort position and in an input position, respectively.

DETAILED DESCRIPTION OF A PREFERRED EMBODIMENT

The invention is particularly applicable to an electronic device handling system for testing integrated circuits. It is in this context that the invention will be described. It will be appreciated, however, that the system and method in accordance with the invention has greater utility. Before describing the invention in detail, a comparison of the footprint of a conventional electronic device handler with an electronic device handler in accordance with the invention will be provided.

Figure 1A:
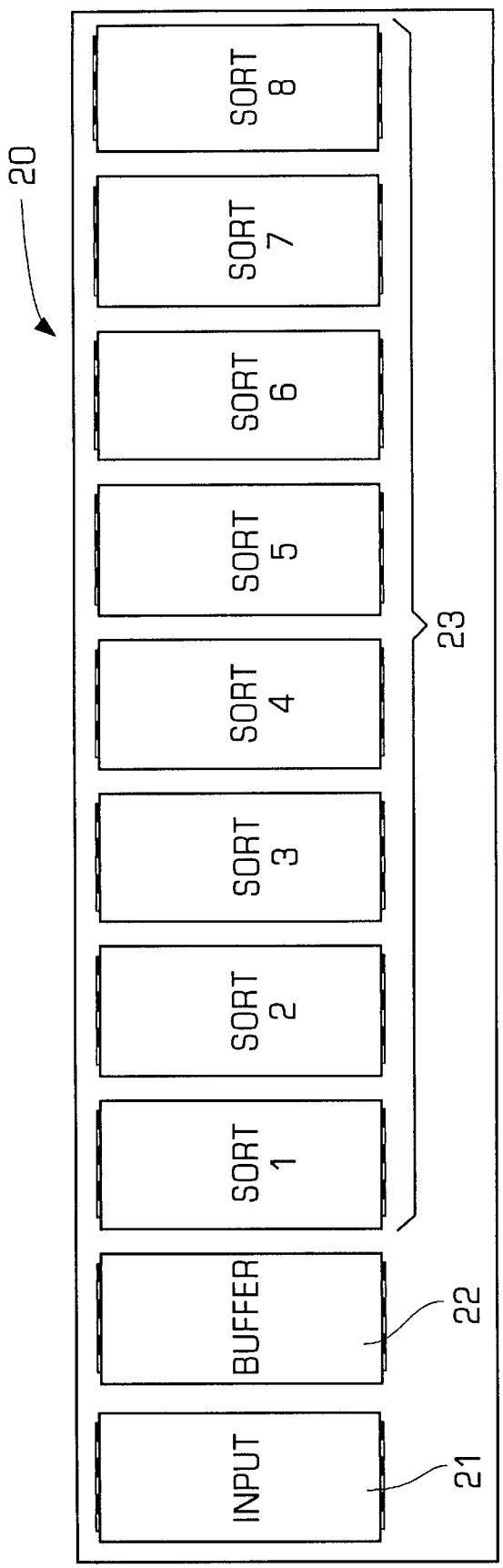
FIGS. 1A and 1B are a top view of a conventionally designed handler and a top view of an electronic device handling system in accordance with the invention, respectively, showing the different in the footprint between the two systems.
Figure 1B:
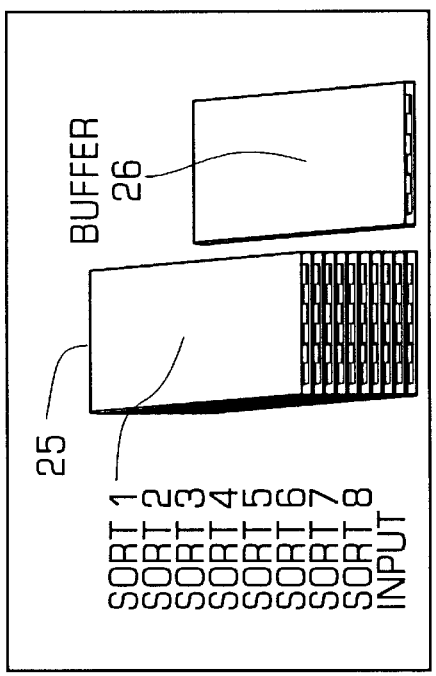

FIG. 1A illustrates the foot print (i.e., the space on a factory floor) of an input bin 21, a buffer bin 22 and a plurality of sort bins 23 of a conventional electronic device handler which are placed next to each other thereby requiring a large amount of floor space and requiring a pick-and-place head to travel a large horizontal distance. By contrast, as shown in FIG. 1B, an electronic device handler 31 in accordance with the invention may include a stack 25 containing an input bin and the plurality of sort bins stacked on top of each other and a buffer bin 26 adjacent to the stack 25. As shown, the electronic device handler 31 occupies less floor space and the pick-and-place head does not travel a large horizontal distance. Now, more details of the electronic device handler 31 will be provided.

Figure 2:
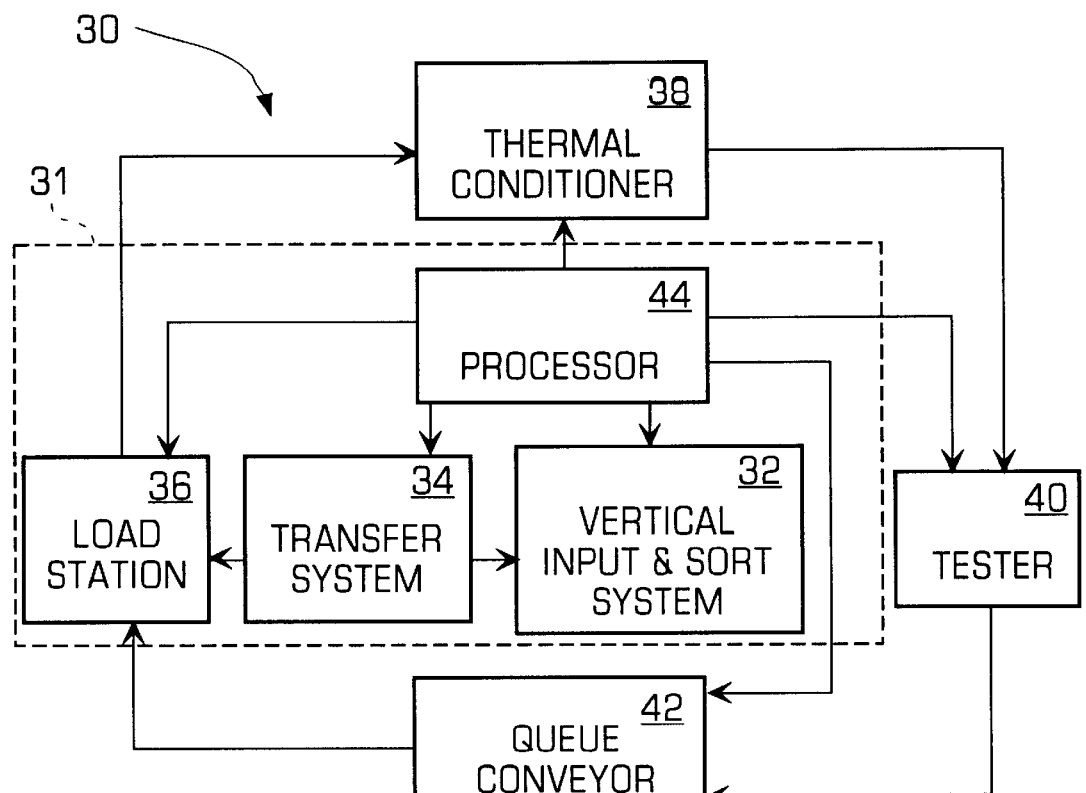
FIG. 2 is a block diagram of an electronic device testing system that may include an electronic device handling system in accordance with the invention.

FIG. 2 is a block diagram of an electronic device testing system 30 that may include an electronic device handling system 31 in accordance with the invention. The term electronic device may include all manufactured electronic items, such as integrated circuits, semiconductor chips, transistors, microprocessors, diodes, hybrid circuits, memory chips, and the like. The electronic device handling system 31 advantageously includes a vertical handling system 32 in accordance with the invention. The vertical handling system is significant in that it is less expensive to build than conventional handling systems, and provides a smaller footprint than conventional handling systems while maintaining the sorting speed necessary for modem testing systems. The vertical handling system loads the electronic devices into the testing system, as described below, and then receives tested electronic devices from the testing system and sorts those tested electronic devices into sort category trays, as described below. The details of the vertical handling system will be described below.

The transfer system may pick untested electronic devices up from input trays in the vertical handler and place those untested electronic devices into a load station 36 of the testing system. Within the load station, the untested electronic devices may be loaded into transport boats and then moved into machine thermal storage (not shown), as is known in the art. The transfer system 34 may also pick up tested electronic devices at the load station 36 and place those tested electronic devices into one of a plurality of sort categories, based on the results of the testing. The sort categories may be stacked vertically on top of each other. In addition, the input trays on which the untested electronic devices are located may also be stacked vertically below the sort category trays to reduce the footprint of the handing system in accordance with the invention.

The vertical stacking of the input trays and the sort category trays provides several advantages. To transfer electronic devices from the input trays to the transport boats, the pick-and-place head only has to move a short horizontal distance, and more importantly, when the electronic devices are being sorted into the sort categories, the pick-and-place head moves the same distance as when it is loading devices so that the distance that the pick-and-place head moves is reduced as compared to conventional handling systems. The vertically stacked sort categories are moved into vertical position so that the pick-and-place head stays substantially in one position while the sort category trays are moved and the vertically stacked sort category trays may be moved in parallel with the pick-and-place head. Since the input and sort category trays are vertically stacked, only a single pick-and-place assembly is used, which reduces the costs of the handling system. The vertical stacking of the sort category trays reduces the footprint of the handling system, and the number of sort categories may be increased without increasing the footprint. In addition, the mechanism that moves the input stack and sort stack is simplified. The number of trays in each sort category is dynamically allocable so that the handling system is more flexible. In addition, the handling system has only to precisely align a single tray position.

Since the speed of the overall testing system is dependent on the speed of the transfer system, this limitation on the movement of the transfer system dramatically increases the overall speed of the testing system, or any other system that may include the vertical handling system in accordance with the invention. As will be described in more detail below, the loading of the electronic devices from the trays of the vertical handling system and the sorting of the tested electronic devices back into sort category trays within the vertical handling system cannot occur simultaneously.

Once the electronic devices are loaded into the transport boats within the testing system, they may go through a thermal conditioner 38 that conditions (i.e., increase or decreases) the temperature of the electronic devices to a specific testing temperature, as is known in the art. Once the electronic devices are conditioned to the testing temperature, the boats carrying the electronic devices enter a test site 40 in which the untested electronic devices are picked up from the boats, tested by contacting the leads of the electronic device and placed back into the boats. The test site may test each electronic device, may then assign a sort category code to each of the electronic devices based on the testing criteria, and may then return the electronic devices to their boats. The tester typically tests several electronic devices at the same time, but may also test the devices individually. The electronic devices may be tested for various functional characteristics and then be sorted into a particular category based on, for example, the speed or the functionality of the particular electronic device. The invention is not limited to any particular type of testing system. Once the electronic devices are tested, the testing system assigns a sort category to the particular electronic device. Once the electronic devices are tested and categorized, the boats with the electronic devices travel through a queueing conveyor 42 that may queue the boats with tested electronic devices until the load station 36 is available.

Once the load station is available, the boat with the electronic devices enters the load station 36 and the tested devices may be removed, according to sort category, and placed in a proper sort category tray in the vertical handling system. When the entire batch of electronic devices has been tested and sorted, the tray stacks of sorted electronic devices may be removed from the vertical handling system 32 by a human operator.

The testing system 30 may be controlled by a processor 44 that may be connected to each of the systems within the testing system. The processor 44 may also be contained within the vertical handling system 32. The processor may, for example, keep track of the capacity of each tray within a sort category so that the system may add an empty tray into a sort category as soon as the other tray is full.

Figure 3:
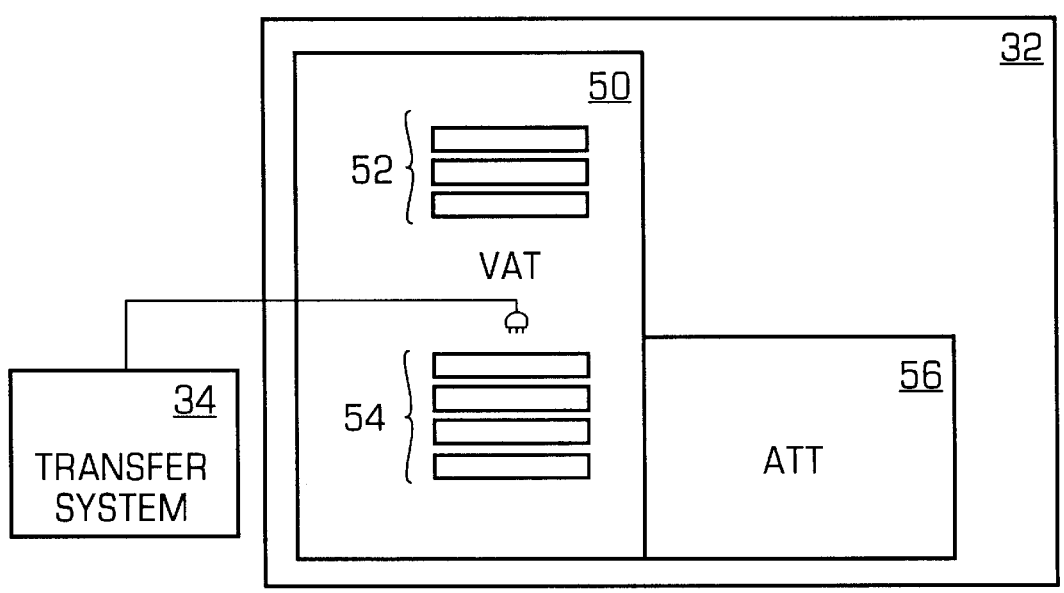
FIG. 3 is a block diagram of a first embodiment of an electronic device handling system in accordance with the invention.

FIG. 3 is a diagrammatic view of a first embodiment of the invention which includes a vertical handling system 32 that may include a vertical auto transport system (VAT) 50 with a vertical sort stack 52 and a vertical input stack 54 that may preferably be vertically stacked on top of each other. The vertical handling system 32 may also include an auto transport tray (ATT) 56. The ATT may remove trays from the input stack once all of the electronic devices on the trays have been transferred into boats, and may store the empty trays. In addition, the ATT may provide empty trays to each of the sort categories, as described below in more detail, once a particular tray in a particular sort category is completely full of tested electronic devices. The trays contained within the vertical handling system 32 may be recycled so that the trays initially used to hold untested electronic devices may also be used as the sort category trays.

In accordance with another aspect of the invention, the input stack and the vertical sort category stack may be separated from each other so that one pick-and-place head may load and/or unload electronic devices from the input stack and a second pick-and-place head may load electronic devices into one of the sort categories. Thus, the input stack and the vertically stacked sort categories may be accessed simultaneously which increases the speed of the handling system.

As shown, the transfer system 34, which may be a pick-and-place head, may move vertically, and only has to move a very limited distance in the horizontal direction. Any vertical adjustments may be done by the VAT 50. In addition, since both the input trays and the sort trays are stacked vertically on top of each other, a single pick-and-place may be used to both load the untested electronic devices from the input stack as well as sort the tested electronic devices into the sort category trays. In addition, while the pick-and-place head may be picking up an electronic device to be sorted, the correct sort category may be positioned so that the pick-and-place head can move without stopping to the sort category.

Figure 4A:
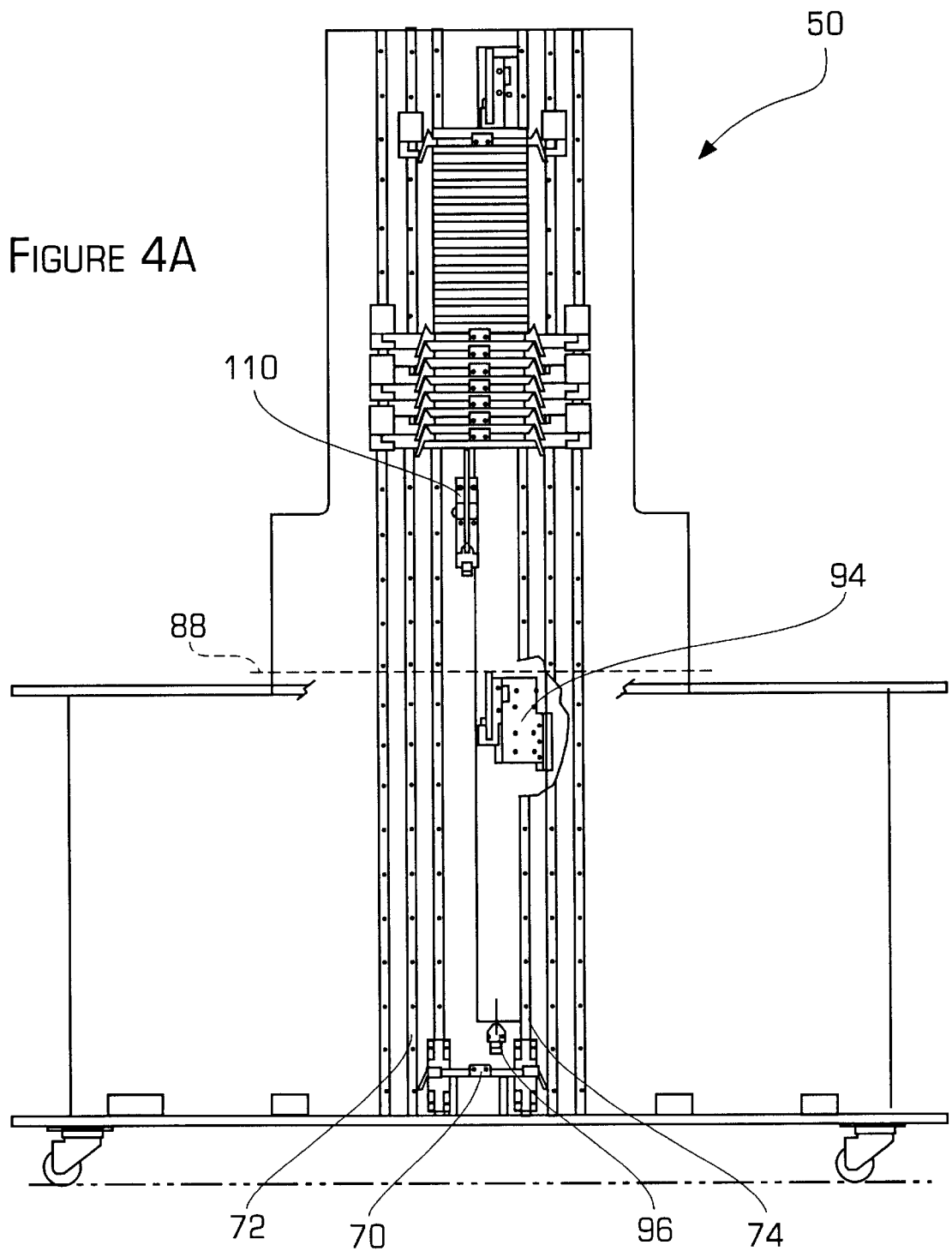
FIGS. 4A, 4B and 4C are a front view, a side view and a cutaway front view, respectively, of the electronic device handling system of FIG. 3.
Figure 4B:
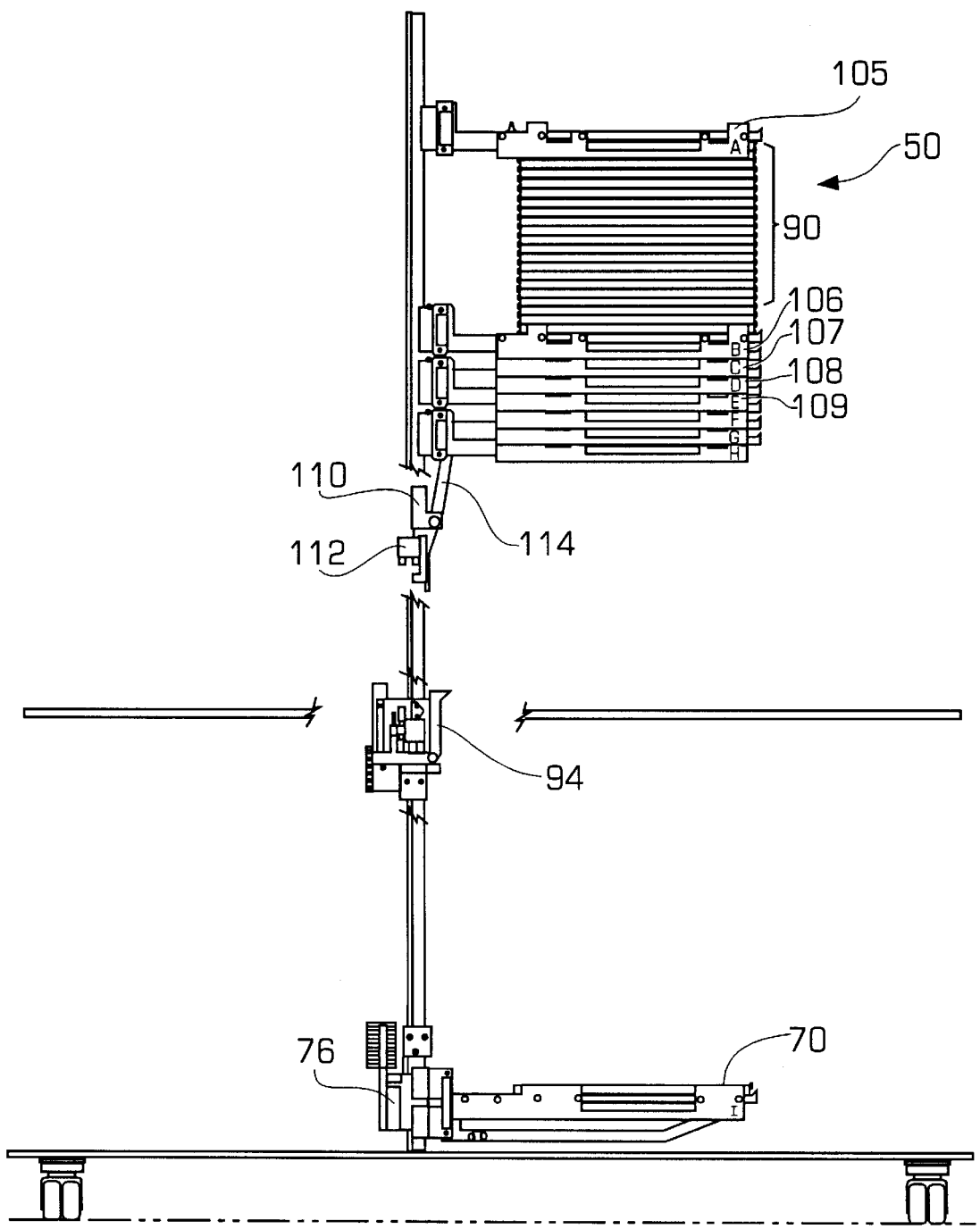
Figure 4C:
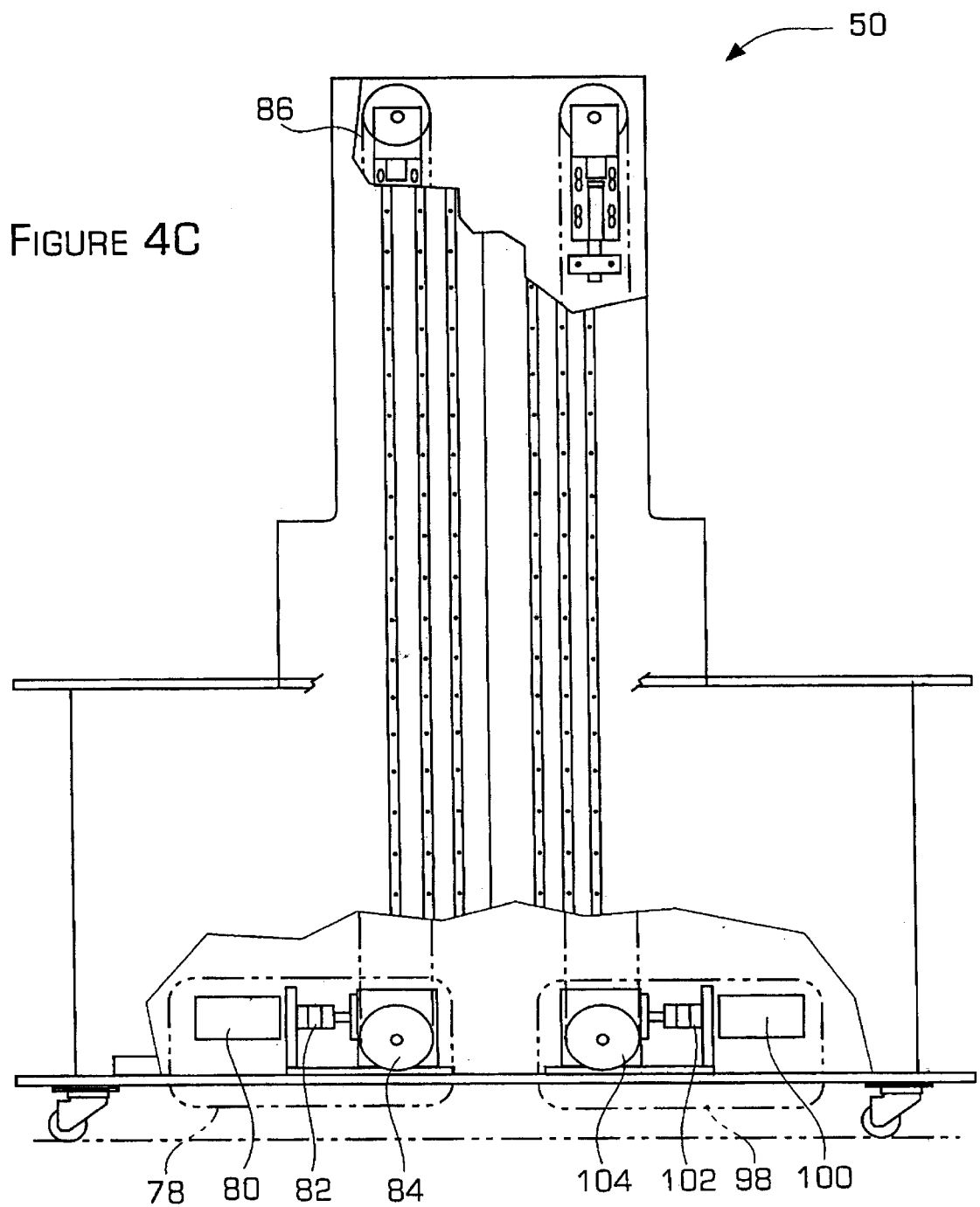

FIGS. 4A, 4B, and 4C illustrate a front view, a side view, and a cutaway front view, respectively, of the vertical auto transport (VAT) 50 of FIG. 3. The VAT may include a lower input stack platform 70 that may be connected to a first rail 72 and a second rail 74 to permit the input stack platform to move in a vertical direction. The input stack platform may be supported by and may slide on the first and second rails. The input stack platform 70 may be moved up and down the rails 72, 74 by an input stack latch 76 that may be permanently attached to the input stack platform. The input stack latch is moved by a first motor assembly 78, as shown in FIG. 4C, that may include a motor 80, a gear system 82, and a pulley mechanism 84 that may move a belt 86 attached to the input stack latch 76. The input stack latch may also be moved by other types of motor assemblies, such as a direct drive motor, a servo motor, or a chain drive motor, and the gear and pulley mechanism may be replaced with a lead screw. Thus, the invention is not limited to any particular type of motor assembly or to any particular weight capacity. The input stack latch 76, in this embodiment, may be able to handle about twenty-five (25) pounds of trays and electronic devices. In addition, in the embodiment shown, the stack of trays on top of the input stack latch 76 may be preferably limited to fourteen (14) inches. However, the invention is not limited to a particular weight or height of trays on the input stack since the motor assembly may be strengthened to handle heavier loads and the vertical size of the VAT may be increased to accommodate higher stacks.

At a transfer or preciser level 88, as is known in the art, a system aligns the trays in the stack so that the transfer system may accurately pick up or place electronic devices into the trays. For example, every time that an electronic device is picked up from a tray or dropped off into a tray, the tray is located at the transfer level so that the tray may be aligned by the preciser. Then the transfer system may accurately pick up or place the electronic device from or into the tray.

A number of sort category trays 90 that are not currently being accessed may be stacked on top of a storage latch 110. The positions of the trays within the VAT will be described below in more detail. The sort tray or input tray that may be currently at the preciser level may be changed rapidly. The sort category trays 90 may be moved vertically by a sort category latch 94 that moves on a rail 96. The sort category latch may pick any number of sort category trays that are resting on the storage latch 110 and may move them vertically so that another tray may be accessed. The sort category latch may be controlled by a motor assembly 98 shown in FIG. 4C. The motor assembly may include a motor 100, a gear box 102, and a pulley mechanism 104 that may be attached to a belt (not shown) which in turn may be connected to the sort category latch. As above, the invention is not limited to any particular type of motor assembly. This sort category latch may move vertically on the rail, and selectively pick up and lift sort category trays so that the exposed sort category tray may be filled with electronic devices. The detailed operation of sort category latch, including a release mechanism will be described below.

Each of the sort categories into which electronic devices are sorted, may have a sort category platform 105, 106, 107, 108, 109 that may support one or more sort category trays. The details of the sort category platform and tray will be described below. The sort category platforms may be moved by the sort category latch, as described above. The number of trays that may be supported by each sort category platform is dynamically allocated as electronic devices are sorted into the sort categories so that, for example, all of the trays may be supported by a single sort category platform because all of the electronic devices have been sorted into that particular sort category. The invention is not limited to any particular number of sort categories, and the number of sort categories may be adjusted depending on the type of testing. In addition, since the number of trays that may be supported by each sort category platform is dynamically allocable, a particular sort category will never be too full to accept electronic devices. Therefore, a particular sort category does not need to be emptied during the middle of testing.

To reduce the amount of weight supported by the sort category which will increase the speed that the latch moves, some of the sort category platforms, and any trays on those platforms, may be supported by a storage latch 110. The storage latch may be fixed in a particular vertical position above the transfer level 88 in this embodiment, but it may also be fixed at any other vertical position. The storage latch may also be completely moveable. In this example, the storage latch may be fixed in position towards the upper portion of the VAT. The operation of the storage latch 110 will be described in more detail below. As shown in FIG. 4A, the storage latch 110 is supporting all of the shown sort category platforms 105–109 and the stack of trays 90. The storage latch may include a latch mechanism 112 and a latch arm 114. The latch arm may be selectively extended by the latch mechanism, as shown in FIG. 4B, when the storage latch is requested to hold some sort category platforms, and then may be retracted so that the sort category platforms may be picked up again and supported by the sort category latch 94. The storage latch permits the sort category latch 94 to store temporarily or permanently unused sort category platforms on the storage latch which reduces the amount of weight the sort category latch must carry. The reduced weight carried by the sort category latch permits the sort category latch to move faster, which in turn permits the quicker change of sort categories. The operation of the VAT 50 will be described below in more detail. A description of the trays used with the VAT will now be provided.

Figures 5A, 5B:
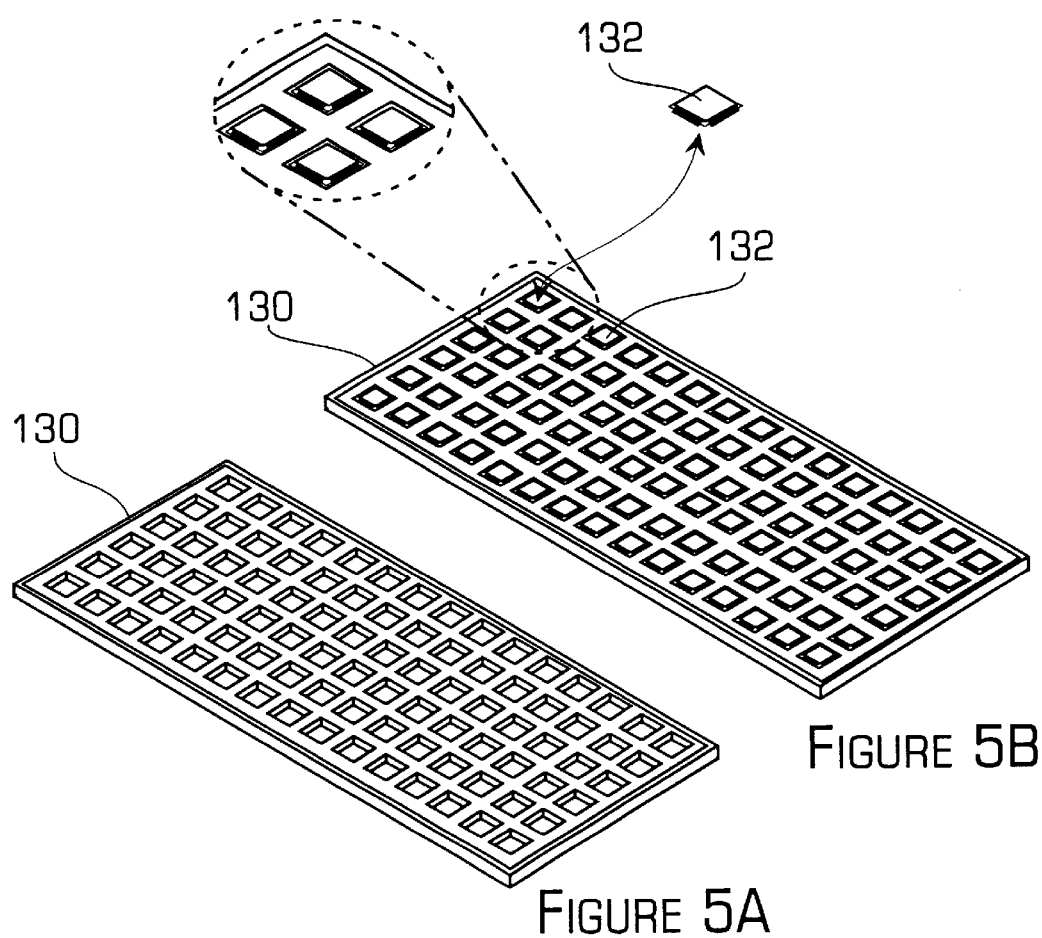
FIGS. 5A and 5B are perspective views of a type of electronic device tray that may be used in the electronic device handling system of FIG. 3.

FIGS. 5A and 5B show perspective views of a standard electronic device tray that may be used in conjunction with the VAT. FIGS. 5A and 5B show an electronic device tray 130, that may be known as a JEDEC tray, empty and full of electronic devices, respectively. As shown, this tray may hold a plurality of electronic devices 132 in an X-Y matrix.

Figures 5C, 5D:
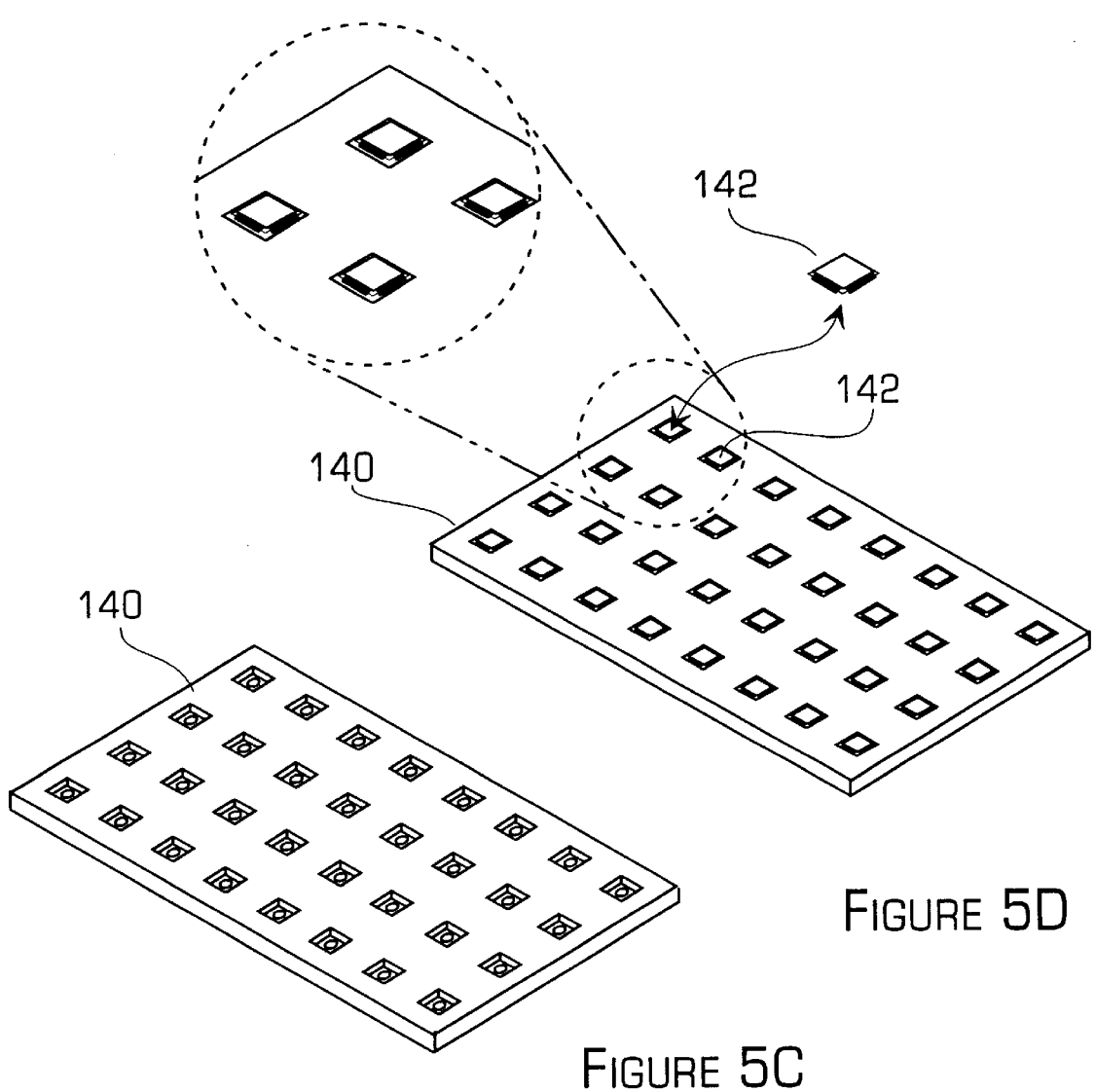
FIGS. 5C and 5D are perspective views of a type of electronic device transport boat that may be used in the electronic device handling system of FIG. 3.

FIGS. 5C and 5C show perspective views of a standard electronic device boat that may be used in conjunction with the VAT. FIGS. 5C and 5D show an electronic device boat 140 empty and full, respectively, that may hold a plurality of electronic devices 142 in an X-Y matrix. This is a common type of electronic device boat. The boats are used to transport untested devices transferred by the VAT from input trays to the test site. Once the devices are tested and assigned a category, the boats transport the devices back to the loading station of the VAT. However, the invention is not limited to any particular type or size of boat or tray since the VAT may be altered to handle any type or size of boat or tray. Now, the input stack and sort category platforms will be described in more detail.

Figure 6:
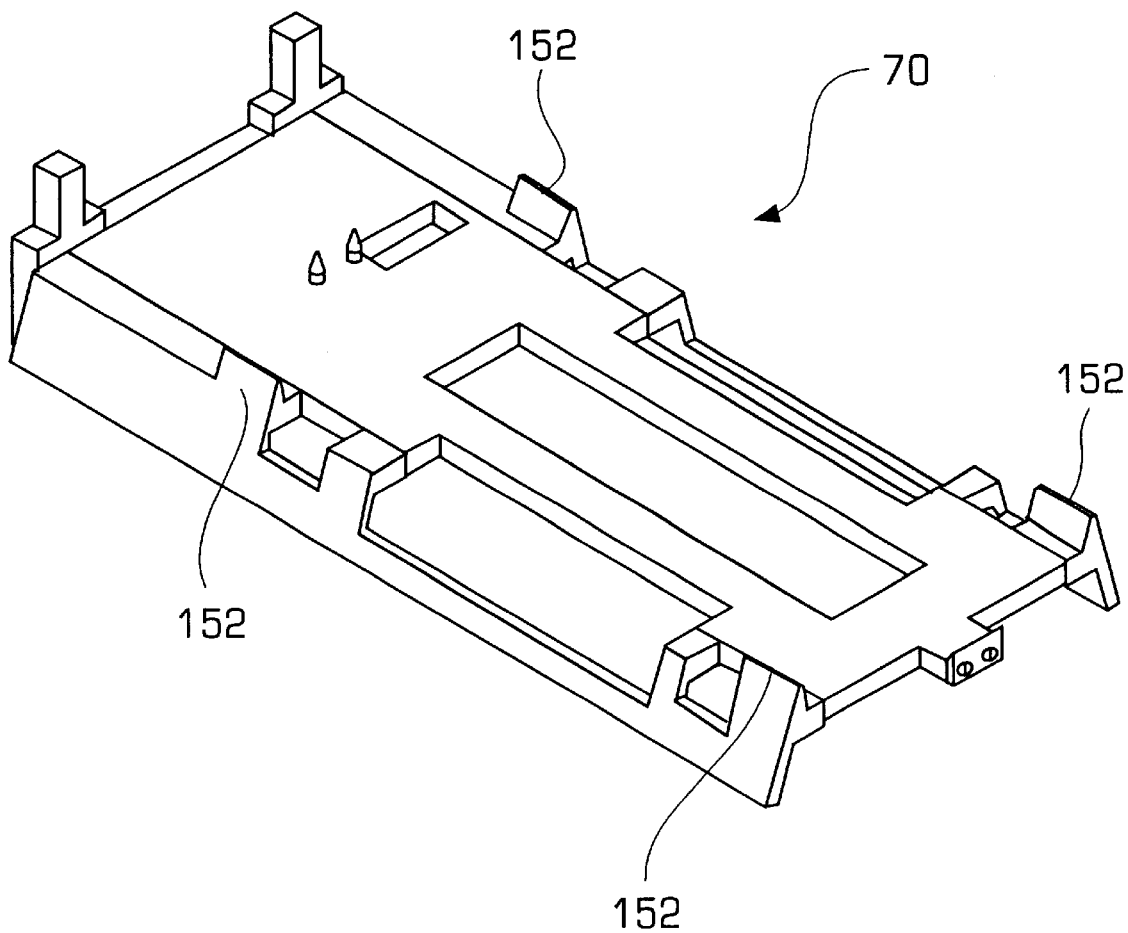
FIG. 6 is a perspective view of an input stack platform of the electronic device handling system of FIGS. 4A, 4B, and 4C.

FIG. 6 is a perspective view of an input stack platform 70 in accordance with the invention. As described above, the input stack platform 70 may hold a plurality of electronic device trays that may be in a vertical stack. The particular input platform shown may support a stack of JEDEC trays shown in FIGS. 5A and 5B. The input platform 70 may also have raised triangle shaped regions 152 which help align the trays within the platform. Other types of trays may also be used, provided that the input stack platform is appropriately modified to handle the new tray size and shape.

Figure 7:
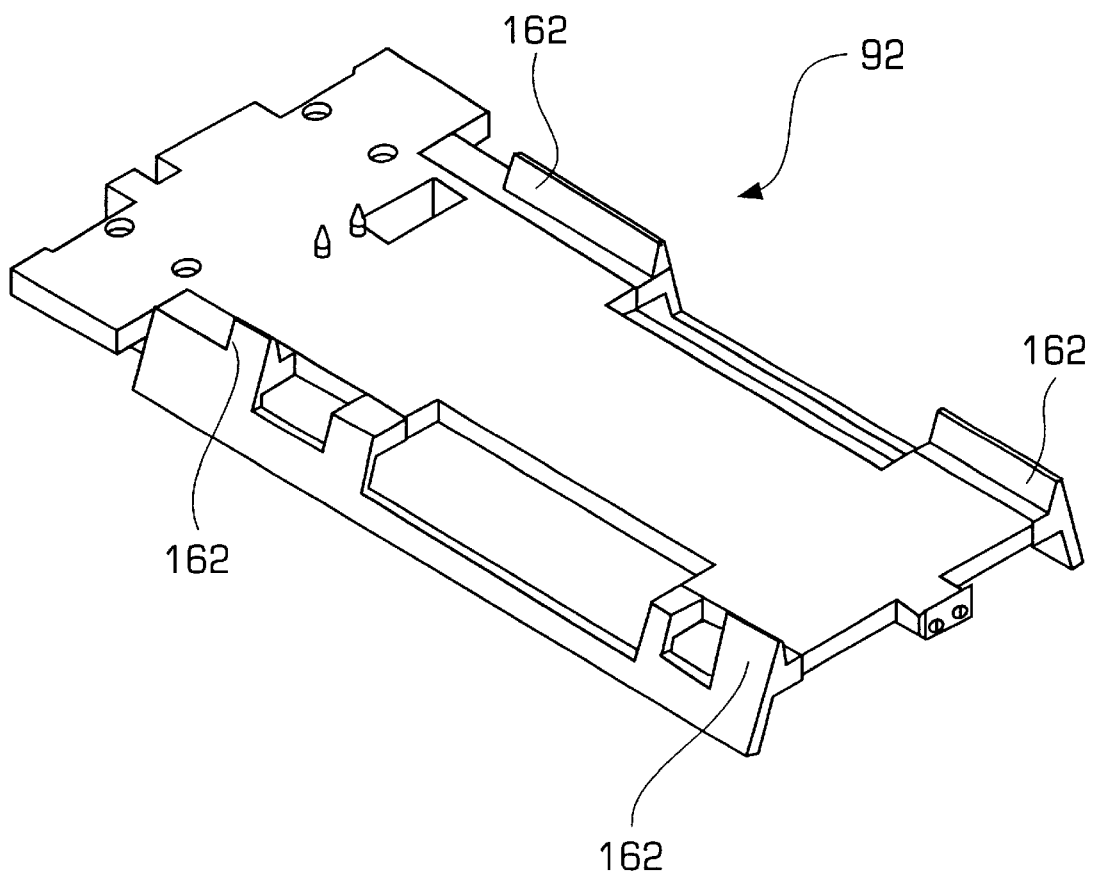
FIG. 7 is a perspective view of a sort category platform of the electronic device handling system of FIGS. 4A, 4B, and 4C.

FIG. 7 is a perspective view of a sort category platform 92 in accordance with the invention. Only a single sort category platform is described, but all of the sort category platforms have a similar structure. As described above, the sort category platform 92 may hold a plurality of electronic device trays that may be in a vertical stack. The sort category platform shown may support JEDEC trays shown in FIGS. 5A and 5B, but the sort category platform may also support other types of trays provided that the sort category platform is appropriately modified to handle the new tray size and shape. The sort category platform may have a raised triangular portion 162 that helps align the JEDEC trays resting on the sort category platform. The sort category platforms may be shaped so that they may be easily stacked on top of each other.

Figure 8:
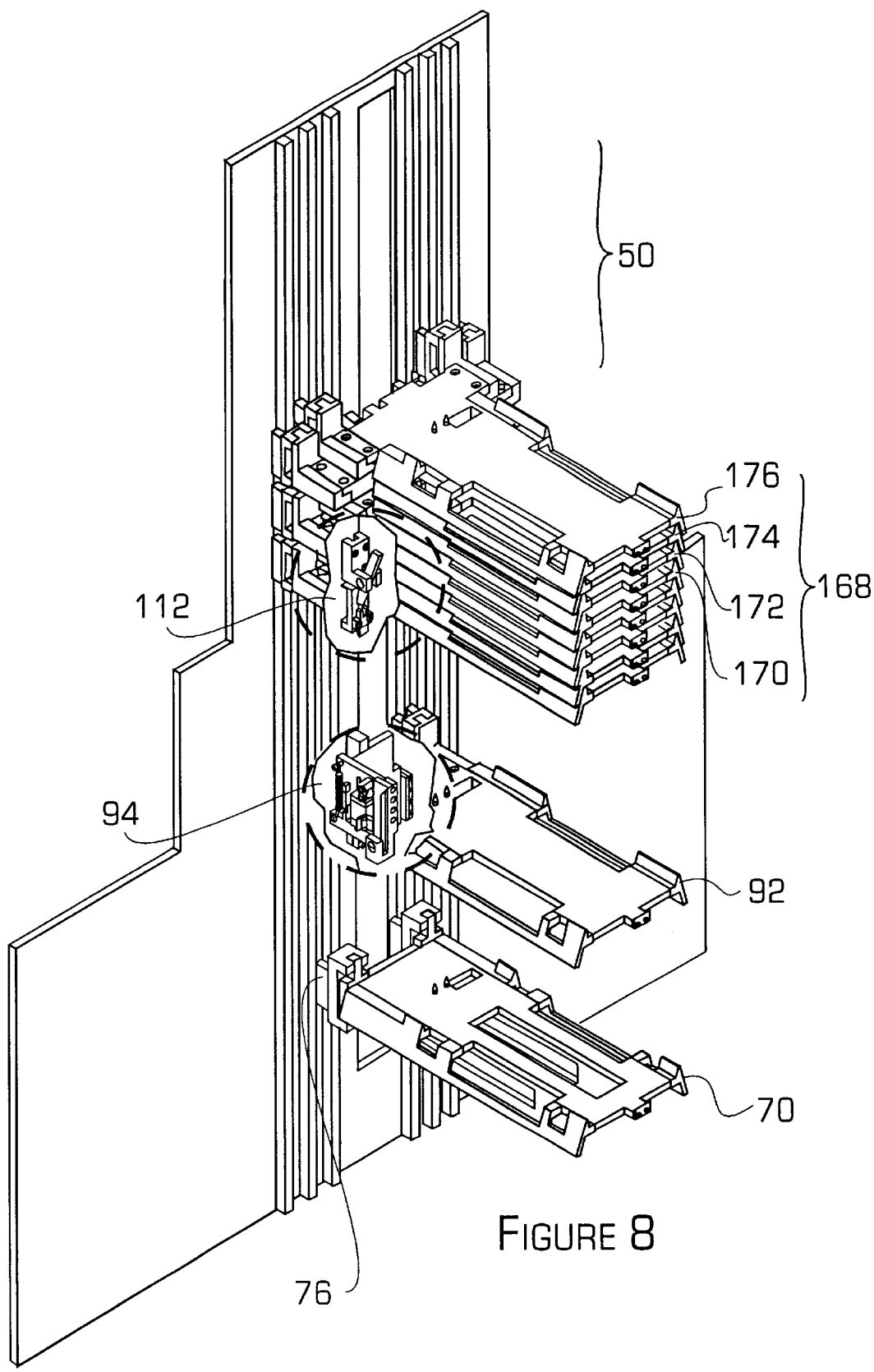
FIG. 8 is a perspective view of the electronic device handling system of FIGS. 4A and 4B.

FIG. 8 is a perspective view of the VAT showing the position of the input stack platform 70 relative to the sort category stack 168 in the vertical auto tray 50. As shown, the input stack platform 70 is located at the vertical lower end of the VAT. For clarity, the trays that would normally be positioned on each of these platforms are not shown. The current sort category platform 92 may be held at the transfer level by the sort category latch 94. As shown, this current sort category platform 92 is the last sort category since the remainder of sort category stack 168, and in particular, all of the other sort category platforms 170, 172, 174, and 176 are being held above the preciser position by the storage latch 110. Now, the structure of the latches 94, 112 will be described.

Figure 9:
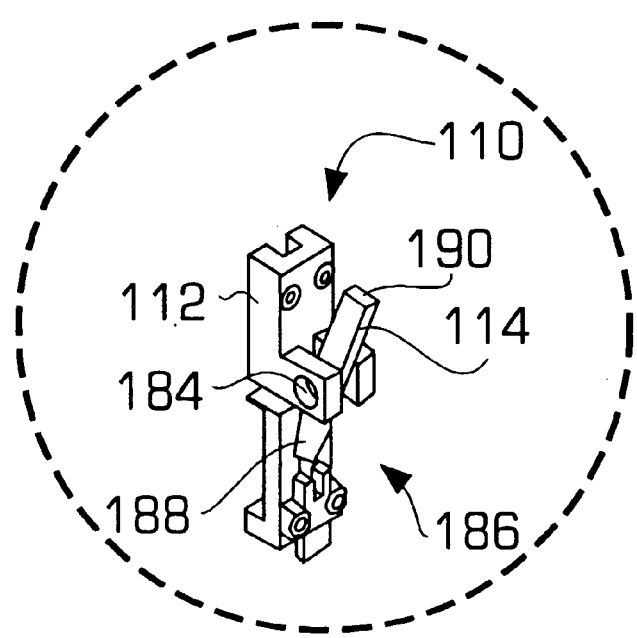
FIG. 9 is a perspective view of a storage latch of the electronic device handling system of FIGS. 4A and 4B.

FIG. 9 is a perspective view of the storage latch 110, that may have a frame 112 and a latch arm 114, as described above. The latch arm may be rotated about an axle 184, and may be moved by an actuator 186. The storage latch, shown in this figure, is in the holding position wherein the latch arm is extended away from the frame. When it is desired to release the sort category platforms that are held by the storage latch, the actuator moves a lower portion 188 of the latch arm 114 outward, which rotates the latch arm about the axle and moves an upper flat portion 190 of the latch arm back towards the frame so that the sort category platforms may be released by the latch. When the latch arm is in the extended position, the sort category platforms rest on the upper flat portion 190 of the latch arm. Now, the sort category latch 94 will be described.

Figure 10:
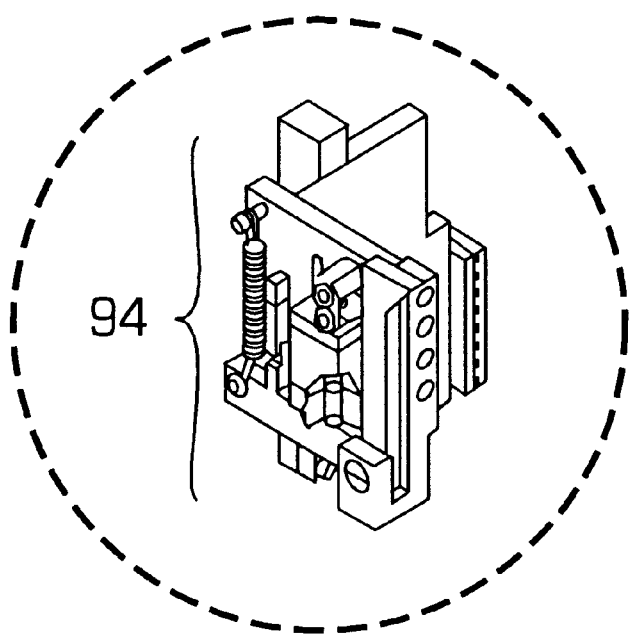
FIG. 10 is a perspective view of a sort category latch of the electronic device handling system of FIGS. 4A and 4B.

FIG. 10 is a perspective view of a sort category latch 94 in accordance with the invention. As described above, the sort category latch may releasably engage one or more of the sort category platforms and may move the sort category platforms in a vertical direction. The sort category latch may also move one or more of the sort category platforms to the storage latch as described above. Now, the structure of the automatic tray transport (ATT 56) will be described.

Figure 11:
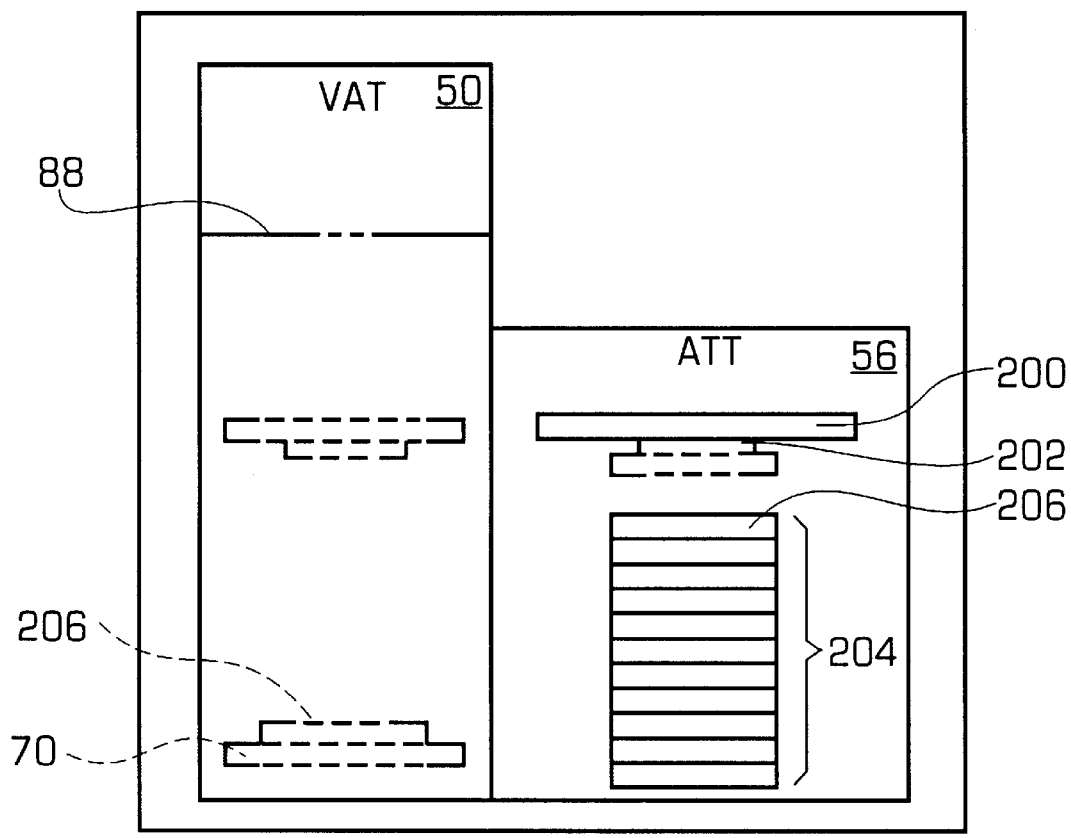
FIG. 11 is a block diagram of an electronic device handling system and an automatic tray transport system (ATT) in accordance with the invention.

FIG. 11 is a diagrammatic view of the VAT 50 and the automatic tray transport (ATT 56). The ATT may include a moveable arm 200 and a handling device 202. The handling device may preferably be a mechanical device, but it may also be any type of device that picks up trays, such as a suction device. The ATT 56 also may include a stack 204 that may be filled with empty trays. In operation, when the VAT 50 is loading devices into boats within the system, and the trays on the input stack are being emptied, the empty trays may be removed from the VAT by the ATT. When a tray is empty, the input platform 70 moves down to a location below the transfer level 88 and the moveable arm 200 of the ATT extends outward over the empty tray on the input platform to position the handling device 202 over the empty tray. The ATT only has to position the handling device in the horizontal direction because then the input platform is moved vertically by the input platform 70 to position the empty tray underneath the handling device. The ATT may also move in the vertical direction if necessary. Once the empty tray has been picked up by the handling device, the arm 200 moves the mechanical device 202 back over the empty tray stack 204 and the empty tray 206 may be placed on top of the empty tray stack.

When the VAT is sorting electronic devices into a particular sort category, and that particular sort category is full, an empty tray 206 must be retrieved from the stack 204 in the ATT. To retrieve an empty tray, the entire input stack of trays, including the particular sort category are lowered so that the particular sort category is below the transfer position 88. Then, the empty tray 206 from the empty tray stack 204 in the ATT 56 is picked up and placed on top of the particular sort category by the handler device. Then, the particular sort category is returned, with the empty tray on top, to the transfer level 88 so that more electronic devices may be sorted into the empty tray. To increase the speed of supplying an empty tray to a particular sort category of the VAT, an empty tray may be held by the handler device 202 so that the handler device does not have to pick an empty tray off of the empty tray stack 204. Thus, the ATT 56 removes empty trays from the VAT during input operation, and supplies empty trays to the VAT during sort operations.

The operation of the vertical auto tray (VAT) 50 will now be described. Some of the operations that the VAT may perform are an initialization procedure, an input procedure, an input-to-sort change, a sort category change, a sort-to-input change, a sort procedure and a jam recovery. Each of these operations may be controlled by software that may be present in the processor 44 of FIG. 2. The software may also be located within each individual part of the system. The software may, for example, control the speed of the motors, the location of each of the platforms at any time, an input operation, removing empty trays during the input operation, a sort operation, supplying empty trays during the sort operation, the initialize operation and a jam recovery operation. The software may also control the changes between the input and sort operations.

In addition, the software tracks all of the electronic devices into sort categories and then keeps track of the capacity of each tray within a sort category to ensure that there is available capacity in each sort category. The VAT may, therefore, prepare the sort category platforms and empty trays in advance. For example, if the second sort category has a top tray with 10 free spaces for tested electronic devices, but the next boat to be sorted has 20 electronic devices for the second sort category, then the ATT will be prepared to put another empty tray onto the second sort category. Thus, tracking each tested electronic device permits the VAT to predict future slowdowns and minimize the effect. The various operations of the VAT system will now be described.

Figure 12A:
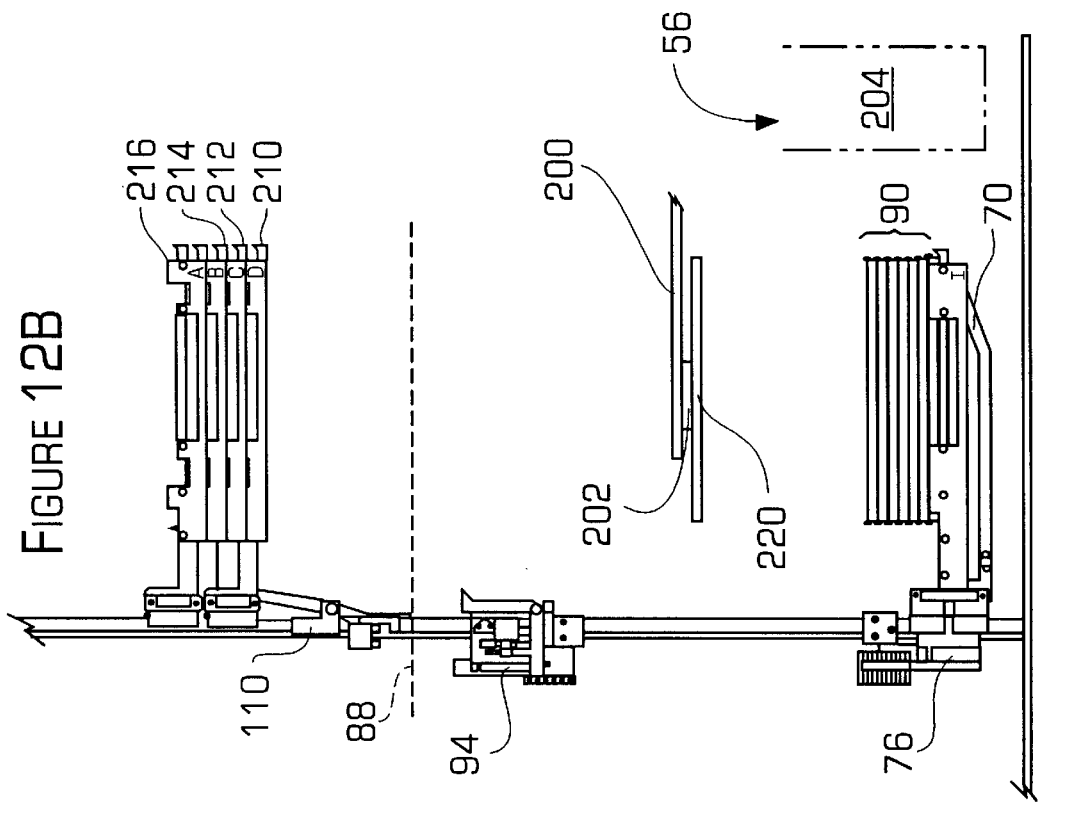
FIGS. 12A and 12B are side views of an electronic device handling system in accordance with the invention in an input position and in an empty tray removal position, respectively.
Figure 12B:
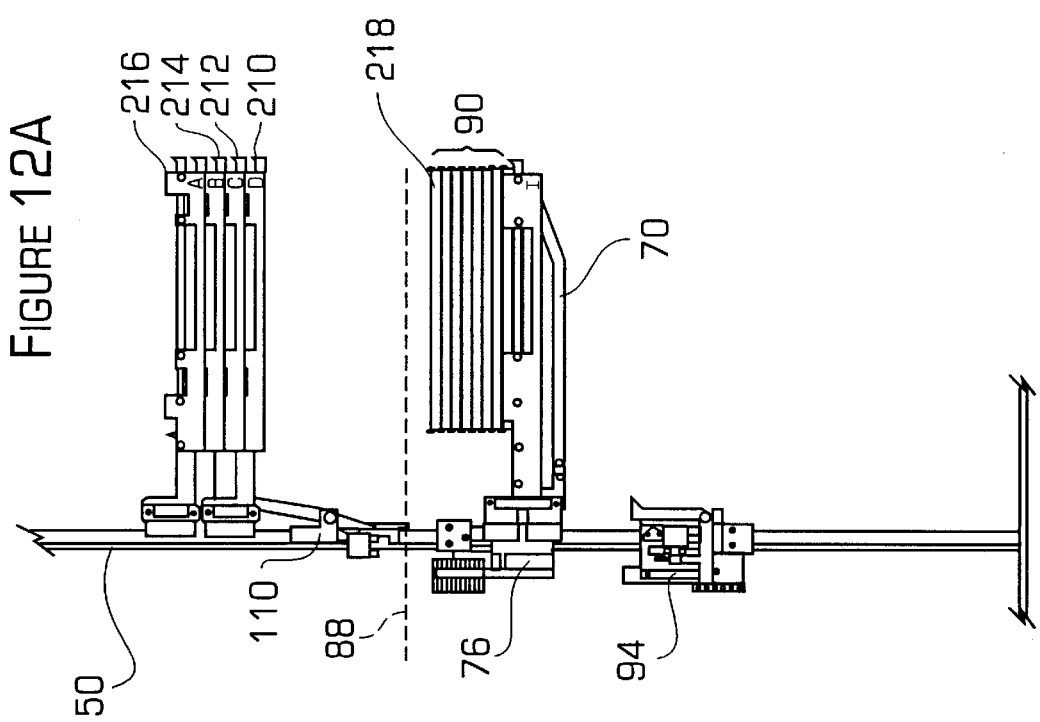

FIGS. 12A and 12B are schematic diagrams of the VAT 50 in an input position and in an empty tray removal position, respectively. In FIGS. 12A, 12B, 13A, 13B, 14A, 14B, 15A, and 15B, four sort category platforms are shown for clarity, such as a first sort category platform 216, a second sort category platform 214, a third sort category platform 212, and a fourth sort category platform 210. Although four sort categories are shown, the invention is not limited to any particular number of sort categories. For example, in an engineering mode for sorting prototype electronic devices, there may be six sort categories, whereas for sorting production electronic devices, there may be only two or three sort categories.

To input new untested electronic devices into the VAT 50, the sort category platforms 210–216 are stored at a position above the transfer level 88 by the fixed storage latch 110. The sort category latch 94 may be positioned anywhere and is not used during the input operation. The stack 90 of trays with untested electronic devices to be input into the VAT are stacked by an operator on the input platform 70 that is connected to the input stack latch 76. A top tray 218 of the input stack 90, that is being currently unloaded, is located at the transfer level 88. As the trays are unloaded, the empty trays are removed, as described below, and the input latch 76 moves the input platform 70 and the stack 90 upwards so that a new top tray full of untested electronic devices is located at the transfer level 88.

As shown in FIG. 12B, to remove an empty tray from the stack 90 during the input operation, the input latch 76 moves the input platform 70 and the stack 90 downwards to a location where the auto tray transport (ATT) 56 may remove an empty top tray 220 from the input stack. As described above, the arm 200 of the ATT places the handling device 202 over the empty tray 220 and picks it up from the stack. Then the empty tray may be placed on the empty tray stack 204, or held by the handling device, as described above. Once the removal of the empty tray is complete, the input latch 76 moves that input platform 70 and the input stack 90 back up to a position where the top tray of the input stack is at the transfer level 88. Now, the operation of changing from an input operation to a sort operation will be described.

FIGS. 13A and 13B are schematic diagrams of the VAT 50 in an input position and in a sort position, respectively. As described above, in the input position, the sort category platforms 210–216 are resting on the storage latch 110, the sort category latch 94 is not being used, and the stack 90 of input trays with untested electronic devices are located on the input platform 70 that may be supported by the input latch 76. The top of the input tray stack may be located at the preciser level 88. Although, in this example, the VAT is shown changing from inputting electronic devices to sorting electronic devices into the fourth sort category platform 210, the VAT may change from the input operation to sorting into any one of the sort category platforms.

To change to the sort operation, the sort category latch 94 is moved into a position above the storage latch 110 so that the sort category latch supports all of the sort category platforms 210–216 and moves all of the sort category platforms down so that the first sort category platform 216 is at the transfer level 88. Any electronic devices that are destined for the first sort category are then loaded into the tray supported by the first sort category platform and then the first sort category platform may be moved by the sort category latch above the storage latch. The storage latch is then extended so that the first sort category platform is supported by the storage latch. Thus, at some time later, as shown in FIG. 13B, the first three sort category platforms 212–216 are supported by the storage latch 110 and the first sort category platform 210 is ready to be loaded with electronic devices. At about the same time, the input stack latch 76 moves the input platform 70 and input stack 90 down so that the first sort category platform 210 is at the transfer level 88. Then, tested electronic devices may be placed in a tray that may be located on the fourth sort category platform. If the particular sort category platform has no trays or does not have any trays with available space for tested electronic devices, then the ATT will place an empty tray, as described above, on the sort category platform. To place an empty tray on a sort category platform, both the input latch 76 and the sort category latch 94 move to a position so that an empty tray may be added on top of the sort category tray. As described above, the total number of electronic devices in each tray (e.g., the capacity of the tray) in each sort category may be tracked by the software running of the VAT so that the VAT knows how full each tray is and when to get a new empty tray ready for a particular sort category. The operation of changing sort categories will now be described.

FIGS. 14A and 14B are schematic diagrams of the VAT 50 changing from sorting tested electronic devices into the fourth sort category 210 to sorting tested electronic devices into the third sort category 212. When sorting tested electronic devices into the fourth sort category platform 210, as shown in FIG. 14A, the fourth sort category platform is located on top of the input stack and is supported by the input stack and the input platform 70. The top tray of the fourth sort category platform is positioned at the transfer level 88. The remaining sort category platforms are supported by the storage latch 110. Then, when the VAT is going to sort some electronic devices into the third sort category platform 212, the sort category latch 94 moves the fourth sort category platform 210 back up above the storage latch 110 and drops off the fourth sort category platform so that it is supported by the storage latch. Then, the sort category latch 94 picks up the fourth and third sort category platforms 210, 212, and moves those two sort category platforms to a position where the top tray of the third sort category platform 212 is positioned at the transfer level 88. As above, the remaining sort category platforms are supported by the storage latch 110. Then, tested electronic devices may be placed into the tray supported by the third sort category platform 212. In a similar manner, the VAT may change from any sort category to any other sort category. The VAT may also sort electronic devices first into trays supported on the first sort category platform 216, then into the trays supported on the second sort category platform 214 and so on so that each completed sort category may be moved up and supported by the storage latch in order to fill the next sort category. Now, the operation of the VAT as it changes from a sort operation to an input operation will be described.

FIGS. 15A and 15B are schematic diagrams of the VAT in the sort operation, and the VAT in the input operation, respectively. In this example of the sort operation, electronic devices are being sorted into the second sort category platform 214 so that the second, third and fourth sort category platforms 210–214 are being supported by the input stack 90 and the input latch 76. In addition, the fourth sort category platform 216 is supported by the storage latch 110. When the VAT switches to the input operation, the sort category latch 94 moves the sort category platforms 210–214 up above the storage latch 110 and releases them so that all of the sort category platforms 210–216 are supported by the storage latch. The sort category latch 94 is then idle. At approximately the same time that the sort category platforms are being moved up to the storage latch, the input latch 76 moves the input platform 70 and the input stack 90 to a position so that the top tray of the input stack is at the transfer level 88. Then, untested electronic devices are picked up from the tray and loaded into the system.

All of these features of the VAT 50, in accordance with the invention, provides enormous advantages. First, since a single pick-and-place head is used and the structure is simple, the VAT is less expensive to build than conventional systems. In addition, due to the vertical stacking of the platforms, the VAT has a small footprint. The VAT may also be easily expanded without using additional floor space. Finally, the VAT is as quick as conventional handlers, but is less expensive to build and does not require as much space.

While the foregoing has been with reference to a particular embodiment of the invention, it will be appreciated by those skilled in the art that changes in this embodiment may be made without departing from the principles and spirit of the invention.

What is claimed is:

1. An apparatus for handling electronic devices in a system that assigns a category corresponding to one of a plurality of predetermined categories to said electronic devices and sorts said electronic devices according to said categories, the apparatus comprising:
   a plurality of platforms, each for supporting one tray that carries one or more electronic devices, and each platform corresponding to one of said categories;
   means for vertically stacking said plurality of platforms in a predetermined order according to said plurality of categories; and
   means for separating a group of stacked platforms vertically away from a platform located at a first position corresponding to a particular category of electronic device to expose a tray and enable the electronic device to be placed on said tray, wherein the separating means further comprises means for storing a platform on a latch that releasably engages said group of stacked platforms.

2. The apparatus of claim 1 further comprising means for moving platforms between said vertical support member and said first position.

3. The apparatus of claim 1, further comprising an input platform for supporting a stack of trays containing untested electronic devices so that the electronic devices are sorted, after testing and categorization, according to the categories into a tray supported by one of said plurality of platforms.

4. The apparatus of claim 3, wherein said input platform comprises means for moving said input platform in a vertical direction so that the top tray supported by said input platform is located in said first position.

5. The apparatus of claim 4 further comprising means for recycling trays from said input platform to one of said plurality of platforms, said recycling means comprises means for removing an empty tray from the top of said stack supported by said input platform, means for storing said empty tray, and means for vertically stacking said empty tray on the top of a tray, filled with electronic devices, supported by one of said plurality of platforms.

6. The apparatus of claim 4, wherein said input platform and said plurality of platforms are vertically aligned.

7. The apparatus of claim 6 further comprising a single transfer device that picks electronic devices from said stack of trays supported by said input platform and places electronic devices into a boat to be transported to a testing station.

8. The apparatus of claim 7, wherein said transfer device moves a substantially similar predetermined horizontal distance to pick electronic devices up from said stack of trays supported by said input stack and to sort electronic devices from the boat into a tray supported by one of said plurality of platforms after testing is completed.

9. An apparatus for handling electronic devices in a system that assigns a category corresponding to one of a plurality of predetermined categories to said electronic devices and sorts said electronic devices according to said categories, the apparatus comprising:
   means for conveying a boat carrying a plurality of categorized electronic devices to an input position;
   a plurality of platforms, each for supporting one or more trays that carry one or more electronic devices, and each platform corresponding to one of said categories;
   means for vertically stacking said plurality of platforms in a predetermined order according to said plurality of categories;
   means for separating a group of stacked platforms vertically away from a platform located at a first position corresponding to a particular category corresponding to the category of an electronic device to expose a tray and enable the electronic device to be placed on said tray, wherein the separating means further comprises means for storing a platform on a latch that releasably engages said group of stacked platforms; and
   a single transfer device that picks up electronic devices from a boat at said input position and places electronic devices, at said first position, into a tray supported by one of said plurality of platforms corresponding to said categories.

10. The apparatus of claim 9 further comprising means for moving platforms between said vertical support member and said first position.

11. The apparatus of claim 9, further comprising an input platform for supporting a stack of trays containing electronic devices so that the electronic devices are sorted according to the categories into a tray supported by one of said plurality of platforms.

12. The apparatus of claim 11, wherein said input platform comprises means for moving said input platform in a vertical direction so that the top tray supported by said input platform is located in said first position.

13. The apparatus of claim 12 further comprising means for recycling trays from said input platform to one of said plurality of platforms, said recycling means comprises means for removing an empty tray from the top of said stack supported by said input platform, means for storing said empty tray, and means for vertically stacking said empty tray on the top of a tray, filled with electronic devices, supported by one of said plurality of platforms.

14. The apparatus of claim 12, wherein said input platform and said plurality of platforms are vertically aligned.

15. A method of handling electronic devices in a system that sorts according to one of a plurality of predetermined categories using a handling system having a plurality of platforms, each platform assigned to each of the sort categories and each platform supporting a tray for holding electronic devices, the method comprising:

moving an electronic device from an input station to a category determining station;

assigning a particular category to said electronic device at the category determining station;

moving an electronic device from the category determining station to a unload position;

vertically moving a platform corresponding to the particular sort category into a transfer position;

placing said electronic device into the tray supported by the platform at the transfer position; and removing a tray from a stack of trays at said input position once they are empty, and storing said empty tray.

16. The method of claim 15, wherein said platforms are vertically stacked and wherein moving comprises separating a group of platforms from the platform corresponding to the particular category so that electronic devices are placed in a tray supported by the particular category platform.

17. The method of claim 16 wherein separating further comprises storing said group of platforms on a vertical support member.

18. The method of claim 15 further comprising changing the category platform into which electronic devices are sorted by moving said plurality of platforms.

19. The method of claim 16 further comprising picking up electronic devices from an input position, and placing electronic devices, at a sort position, into a tray supported by one of a plurality of platforms corresponding to said categories.

20. The method of claim 16 further comprising switching between picking up electronic devices in an input position and placing electronic devices in said sort position.

21. The method of claim 15, further comprising placing an empty tray on to a particular category platform when the top tray of that particular platform is full, wherein providing an empty tray comprises moving said top tray of said particular category platform into a reloading position, retrieving a stored empty tray, and placing said stored empty tray on top of the top tray of the particular sort category platform.

* * * * *